(12) United States Patent
Veredas-Ramirez et al.

(10) Patent No.: US 7,323,904 B2
(45) Date of Patent: Jan. 29, 2008

(54) LOOK-UP TABLE

(75) Inventors: Francisco-Javier Veredas-Ramirez, Munich (DE); Michael Scheppler, Gröbenzell (DE)

(73) Assignee: Infineon Technologies AG, Munich (DE)

( * ) Notice: Subject to any disclaimer, the term of this patent is extended or adjusted under 35 U.S.C. 154(b) by 97 days.

(21) Appl. No.: 11/051,659

(22) Filed: Feb. 4, 2005

(65) Prior Publication Data

US 2005/0174144 A1 Aug. 11, 2005

(30) Foreign Application Priority Data

Feb. 11, 2004 (DE) ............... 10 2004 006 769

(51) Int. Cl.
*H01L 25/00* (2006.01)
*H03K 19/177* (2006.01)

(52) U.S. Cl. ................ 326/41; 326/38; 326/40; 326/47

(58) Field of Classification Search ........ 326/37–38, 326/40–41, 47; 327/407–408; 365/189.02, 365/230.02
See application file for complete search history.

(56) References Cited

U.S. PATENT DOCUMENTS

| | | | |
|---|---|---|---|
| 5,740,069 A * | 4/1998 | Agrawal et al. ......... 716/16 |
| 5,760,602 A | 6/1998 | Tan | |
| 6,011,740 A | 1/2000 | Trimberger | |
| 6,118,300 A * | 9/2000 | Wittig et al. .......... 326/41 |
| 6,266,801 B1 * | 7/2001 | Jin ..................... 716/8 |
| 6,356,110 B1 * | 3/2002 | Reddy et al. .......... 326/41 |
| 6,373,279 B1 * | 4/2002 | Bauer et al. .......... 326/40 |
| 6,445,209 B1 * | 9/2002 | Young et al. .......... 326/41 |
| 6,462,577 B1 * | 10/2002 | Lee et al. ............. 326/40 |
| 6,501,677 B1 | 12/2002 | Rau et al. | |
| 6,747,478 B2 * | 6/2004 | Madurawe ............ 326/39 |
| 6,747,480 B1 * | 6/2004 | Kaptanoglu et al. .... 326/41 |
| 6,798,240 B1 * | 9/2004 | Pedersen ............. 326/39 |
| 6,914,449 B2 * | 7/2005 | Kaviani .............. 326/41 |
| 7,019,557 B2 * | 3/2006 | Madurawe ............ 326/38 |
| 2003/0071653 A1 * | 4/2003 | Carberry et al. ....... 326/40 |
| 2004/0017222 A1 * | 1/2004 | Betz et al. ........... 326/41 |

* cited by examiner

*Primary Examiner*—Rexford Barnie
*Assistant Examiner*—Jason Crawford
(74) *Attorney, Agent, or Firm*—Brinks Hofer Gilson & Lione

(57) ABSTRACT

A read out device for reading out a data word from a memory cell is described. The read out device has memory cells, inputs for input variables for selecting a memory cell and a hierarchical arrangement of multiplexers having N hierarchical levels. The control inputs of the multiplexers of a hierarchical level are connected to an input, the inputs of the hierarchical arrangement of multiplexers are connected to the outputs of the memory cells and the number of memory cells is less than $2^N$.

12 Claims, 9 Drawing Sheets

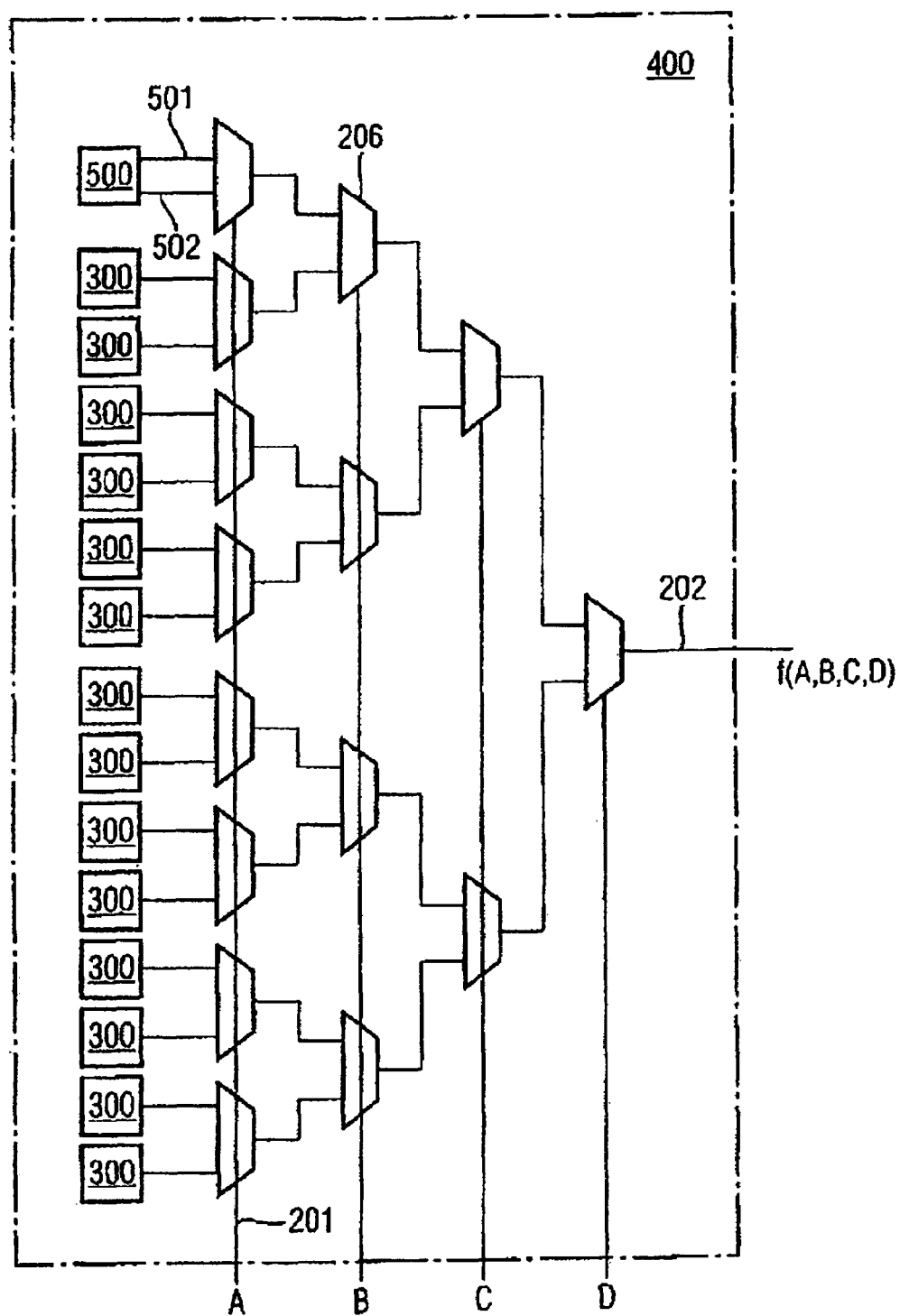

FIG. 11
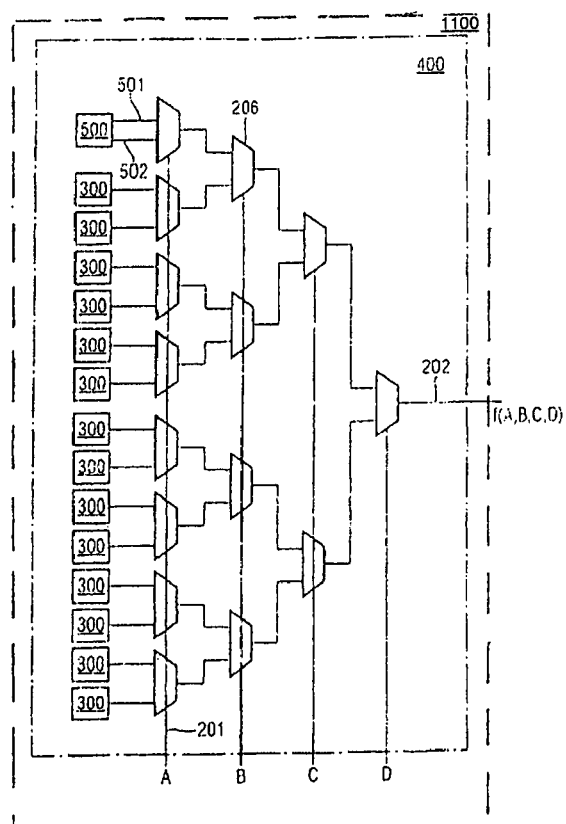
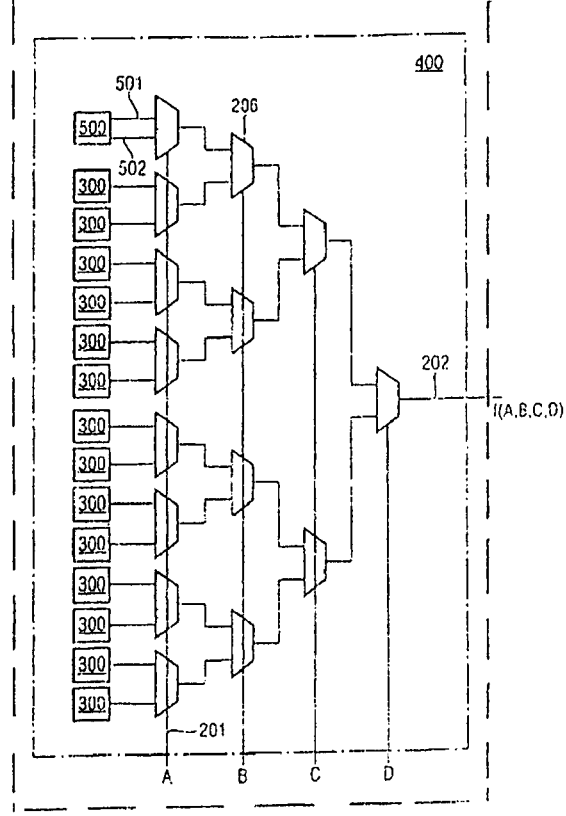

LOOK-UP TABLE

PRIORITY

This application claims the benefit of priority to German Patent Application 10 2004 006 769.4, filed on Feb. 11, 2004, herein incorporated by reference in its entirety.

TECHNICAL FIELD

The invention relates to a look up table. In particular, the invention relates to a look up table that is implemented in a configurable logic cell of a Field Programmable Gate Array (FPGA).

BACKGROUND

Field Programmable Gate Arrays (FPGAs) represent a group of logic circuits which can be programmed by the user himself. FPGAs contain a multiplicity of configurable logic cells in which signal processing is carried out at the bit level. A configurable logic cell generally comprises a look up table (LUT), which permits the implementation of a Boolean function with N input variables and one output variable. In this case, by means of a multiplexer tree whose branches are fed by bits stored in memory cells, in a work step, a bit is in each case read out in a manner dependent on the N input variables which control the multiplexers. Theoretically, any function can be mapped between the inputs and the output of the look up table. In practice, however, the number of inputs is usually limited to four to five since more complex basic gates are only rarely required.

The automated design of FPGA applications is based on its so called synthesis. In this case, the synthesis tools map a logic function in high level language description, e.g. VHDL (Very high speed integrated circuit Hardware Description Language), onto a plurality of configurable logic cells.

Conventional look up tables with more than three inputs have a high degree of redundancy and, for the most part, unutilized capacity. By way of example, a look up table having four inputs can represent $2^{16}$=65536 logic functions. However, many of these functions can be traced back to other functions again through permutations of the inputs. Overall, there are 3984 permutation classes of this type in the aforementioned case. However, even this number of functions is generally still too large to enable it to be expediently utilized in the synthesis. For the implementation of the look up table in the logic cell, this means that a relatively large amount of area is required which is ultimately not utilized expediently. Furthermore, as the number of inputs of the logic cell rises, so does the hardware outlay required in order to configure the memory cells of the logic cell.

BRIEF SUMMARY

A look up table is provided which is implemented in hardware. The look up table requires less area in comparison with conventional look up tables and can be configured with a lower outlay. In this case, on account of the generally only low utilization of the available logic functions, it can be accepted that fewer logic functions can be represented by means of the look up table. In particular, an FPGA containing configurable logic cells with a look up table is provided.

By way of introduction only, in one embodiment, the read out device serves for selecting a memory cell from a plurality of memory cells and for reading out a data word, in particular a data bit, from the selected memory cell. The read-out device has a plurality of memory cells, in each of which a data word, that is to say a bit, for example, is stored, and a plurality of inputs for feeding in input variables. The memory cell whose data word is intended to be read out is selected on the basis of the input variables. The read-out device accordingly constitutes a look up table which is realized in hardware.

In order to be able to output the data word of the selected memory cell, the read out device comprises a hierarchical arrangement of multiplexers having N hierarchical levels or stages. The number of inputs of a multiplexer is M in each case. The control inputs of all the multiplexers of a hierarchical level are connected to an input of the read out device. The multiplexers are consequently controlled by means of the input variables. The outputs of the memory cells are connected to the inputs of the hierarchical arrangement consisting of multiplexers. The number of memory cells is less than $M^N$, where the numbers M and N are natural numbers.

The hierarchical multiplexer arrangement represents a multiplexer tree, the memory cells being connected to the ends of the branches of the multiplexer tree. However, the multiplexer tree does not have a complete regularity that it would have if the number of memory cells were equal to $M^N$, as is the case with the multiplexer trees of conventional read-out devices or look-up tables.

It emerges from what has been stated previously that, in the case of the multiplexer tree provided, each input of a multiplexer is connected either to an output of a further multiplexer or an output of a memory cell. In order that ultimately fewer than $M^N$ memory cells are used, however, for example at least one memory cell is connected to two branch ends of the multiplexer tree or at least one multiplexer has been saved in the multiplexer tree, so that a hierarchical level is thereby skipped.

From the saving of at least one memory cell compared with conventional look up tables, a smaller area is used to implement the present read-out device. Furthermore, the configuration of the memory cell saved is also obviated, thereby reducing the outlay used for configuration of the memory cells. It should be taken into consideration, however, that on account of the saving of at least one memory cell, fewer functions can be represented by means of the read out device. However, since—as already explained above—the capability of a read-out device for representing functions is usually not fully exhausted, the advantages mentioned outweigh this disadvantage.

In order to be able to distinguish between the individual hierarchical levels better hereinafter, each hierarchical level is allocated an index k running from 1 to N. In this case, the lowest hierarchical level, i.e. the hierarchical level that usually mostly has multiplexers, is referred to as the first hierarchical level, and the highest hierarchical level, which is connected directly upstream of the output of the readout device and consists of one multiplexer, bears the index N.

In accordance with another embodiment, a hierarchical level having the index k has fewer than $M^{N-k}$ multiplexers. In the case of a regular multiplexer tree, each hierarchical level would have precisely $M^{N-k}$ multiplexers. By virtue of the fact that now at least one multiplexer is saved in a hierarchical level, the area required for implementing the read out device is reduced.

Another embodiment provides for the output of at least one memory cell to be connected to a multiplexer from the second or a higher hierarchical level. This means that a multiplexer in the first hierarchical level is saved. Furthermore or as an alternative thereto, the output of at least one multiplexer from the kth hierarchical level may be connected to an input of a multiplexer from the (k+2)th or a higher hierarchical level. A multiplexer in the (k+1)th hierarchical level is saved in this case.

Preferably, the hierarchical arrangement of multiplexers having a number of N hierarchical levels comprises a regular hierarchical arrangement of multiplexers having a number of N−1 hierarchical levels. In this case, the regular hierarchical arrangement of multiplexers is connected upstream of an input of the multiplexer of the highest hierarchical level. In the regular hierarchical multiplexer arrangement having N−1 hierarchical levels, each hierarchical level comprises precisely $M^{N-k-1}$ multiplexers and the inputs of the multiplexers of the first hierarchical level are in each case connected to precisely one output of precisely one memory cell. In other words, a completely regular multiplexer tree is connected upstream of at least one input of the multiplexer of the Nth hierarchical level, while according to the embodiment reduced multiplexer trees are connected upstream of the remaining input or inputs of said multiplexer. Calculations have revealed that a particularly large number of logic functions can be represented by means of this embodiment despite the reduction of the memory cells.

With regard to the above described embodiment, the reduced multiplexer trees may have in each case precisely one multiplexer per hierarchical level. Similarly, a memory cell can also be saved by at least one memory cell being connected to more than one input of a multiplexer. For this purpose, the at least one memory cell preferably has two outputs. The data word stored in the memory cell can be tapped off at the first output, while the inverse of the data word stored in the memory cell can be tapped off at the second output. The number M of inputs of the multiplexers may be two in each case, i.e. 2:1 multiplexers are involved. In order that the memory cells can be configured with data words, they preferably have configuration inputs.

Another embodiment relates to a read out device by means of which at least two memory cells can be selected and the data words or data bits stored in the relevant memory cells can be read out. This read-out device comprises at least two of the above-described read-out devices. The multiplexer arrangements of these at least two read-out devices in each case comprise the same number of hierarchical levels. In particular, the multiplexer arrangements are also constructed identically, i.e. they have multiplexer trees that are reduced in the same way. Furthermore, the at least two read-out devices are connected in parallel, so that inputs associated with the same hierarchical levels are in each case fed with the same input variables. Consequently, the content of a memory cell, that is to say a data bit, for example, is read out from each of the at least two read out devices at the same time.

The programmable logic arrangement, which is an FPGA, in particular, comprises configurable logic cells containing at least one read-out device according to the invention. Consequently, the programmable logic arrangement has the same advantages as the read out device in comparison with conventional programmable logic arrangements.

The foregoing summary has been provided only by way of introduction. Nothing in this section should be taken as a limitation on the following claims, which define the scope of the invention.

BRIEF DESCRIPTION OF THE DRAWINGS

The invention is explained in more detail below in an exemplary manner with reference to the drawings, in which:

FIG. 5 shows a circuit diagram of a first exemplary embodiment of the read out device according to the invention;

FIG. 11 shows a circuit diagram of another exemplary embodiment of the read out device according to the invention.

DETAILED DESCRIPTION OF THE DRAWINGS AND THE PRESENTLY PREFERRED EMBODIMENTS

Figure 1:
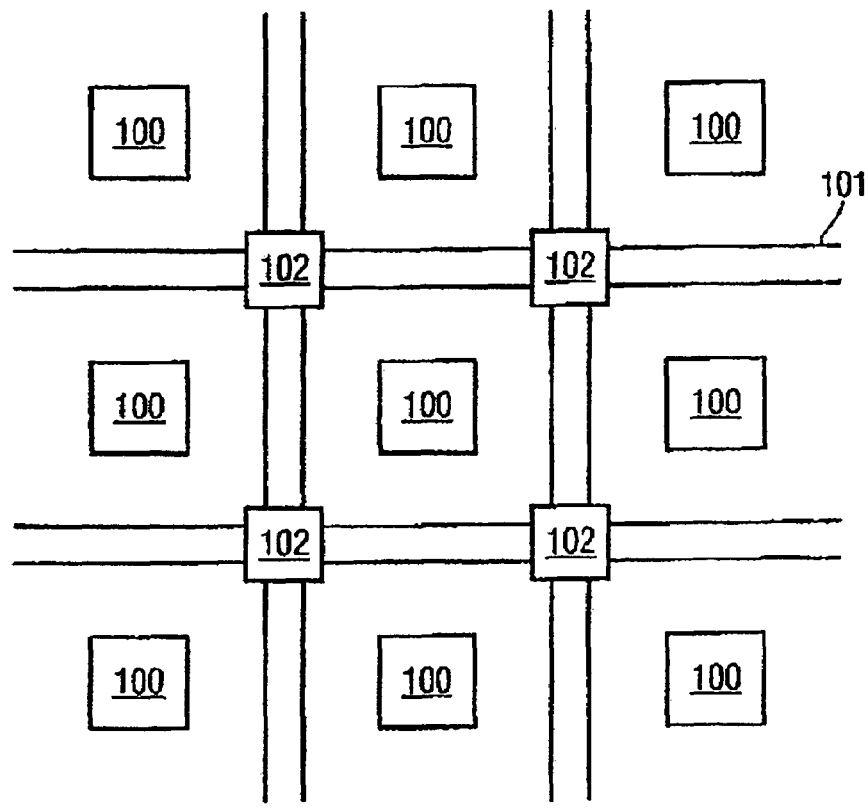
FIG. 1 shows a schematic illustration of the architecture of an FPGA in accordance with the prior art.

FIG. 1 schematically illustrates the architecture of an FPGA. FPGAs typically have a highly regular architecture that serves for implementing logic operations. FPGAs comprise configurable logic cells 100, which are fed or read via buses 101. For this purpose, feed in cells (signal fan in cells) which are not illustrated in FIG. 1 forward signals from a bus 101 to a configurable logic cell 100. Distribution cells (signal fan out cells), which are likewise not illustrated in FIG. 1, feed the output signals of the configurable logic cells 100 to the buses 101. Changeover cells (switch matrix cells) 102 permit selection of a specific signal path in the network comprising the buses 101.

Figure 2:
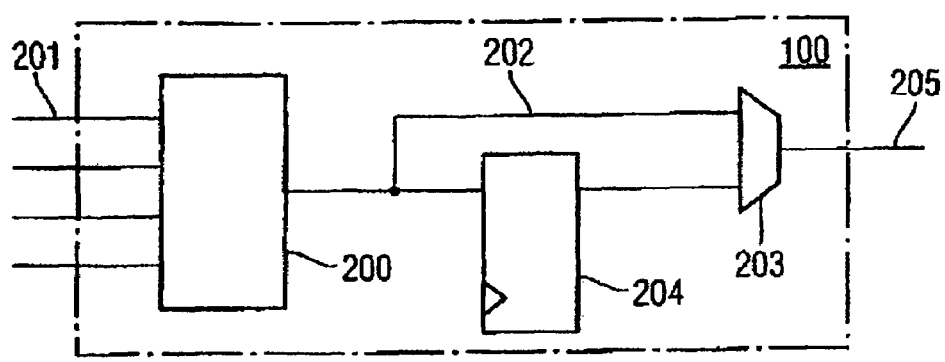
FIG. 2 shows a block diagram of a configurable logic cell in accordance with the prior art.

FIG. 2 represents a block diagram of a conventional configurable logic cell 100. The configurable logic cell 100 contains a look up table or read out device 200, which is fed with four input variables at its inputs 201. A bit can be tapped off at the output 202 of the read out device 200 in a manner dependent on the four input variables. The bit feeds an input of a multiplexer 203 and the input of a flip flop 204. The other input of the multiplexer 203 is fed by the output of the flip flop 204. The output of the multiplexer 203 is the output 205 of the configurable logic cell 100, at which the bit selected as a result of the four input variables is read out.

Figure 3:
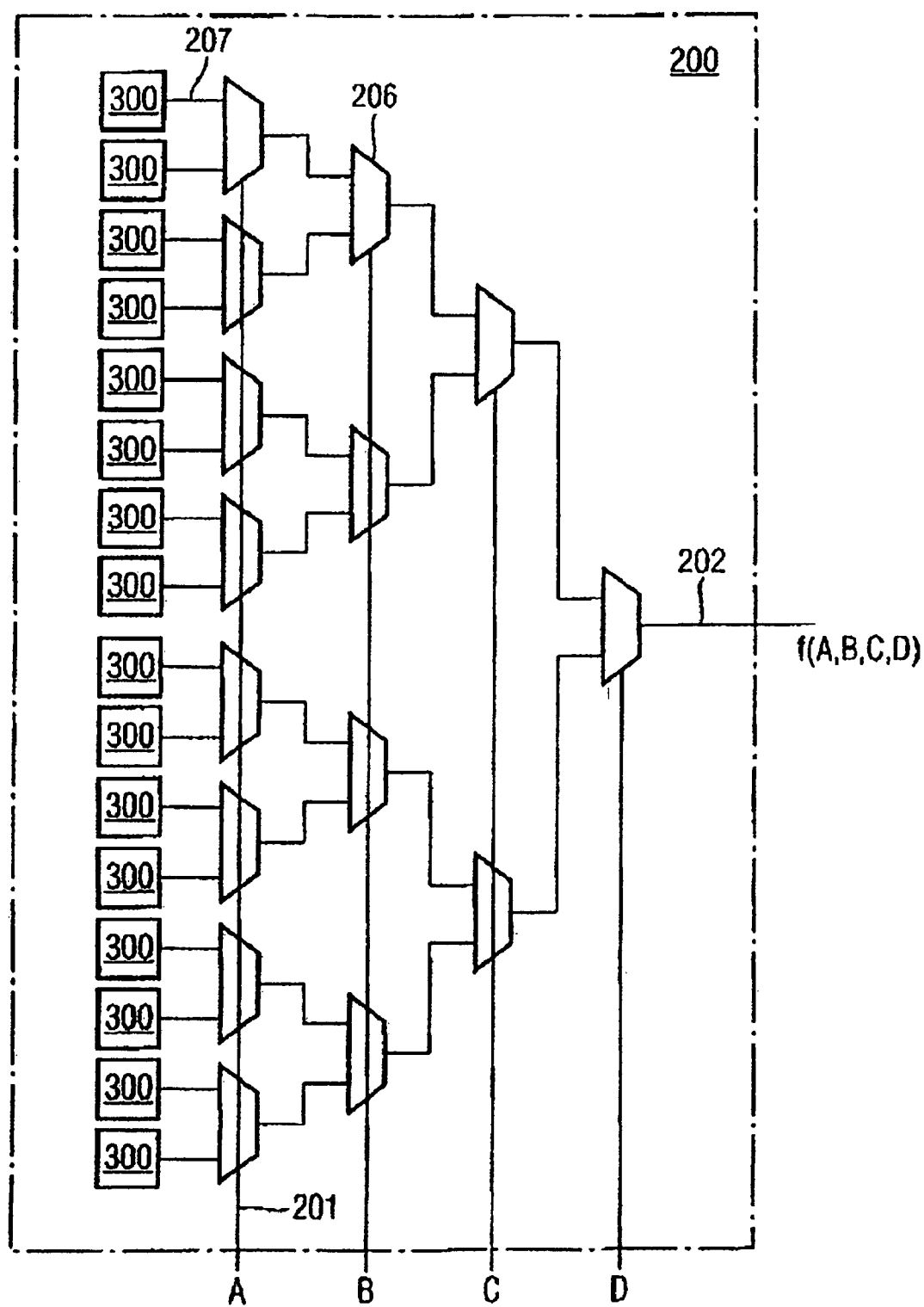
FIG. 3 shows a circuit diagram of a look up table in accordance with the prior art.

FIG. 3 represents a circuit diagram of a read out device 200 in accordance with the prior art. The read out device 200 contains a plurality of multiplexers 206 each having two inputs, which are arranged in the form of a multiplexer tree. This gives rise to a hierarchical arrangement of the multiplexers 206 with a total of four hierarchical levels. The inputs of the multiplexers 206 arranged in the lowest hierarchical level are in each case connected to the output 207 of a memory cell 300. A bit is stored in each memory cell 300. The control inputs of all the multiplexers 206 of a hierarchical level are in each case coupled to one of the inputs 201 of the read out device 200.

The structure of the read out device 200 represented in FIG. 3 can be generalized. Each hierarchical level can be assigned an index k, for example, in which case k=1 holds true for the lowest hierarchical level, i.e. for the multiplexers 206 coupled to the memory cells. If the number of hierarchical level is N and the number of inputs per multiplexer is M, then the kth hierarchical level has a number of precisely $M^{N-k}$ multiplexers 206. The number of memory cells 300 is then $M^N$. The read out device 200 shown in FIG. 3 has N=4 and M=2. $2^{16}$=65536 logic functions can be represented by means of the read out device 200 illustrated in FIG. 3. Given N hierarchical levels, the number amounts to $2_{2^N}$. The number of permutation classes for the read out device 200 is 3984.

During the operation of the configurable logic cell 100, the input variables A, B, C and D are fed into the inputs 201. As a result of the setting of the multiplexers 206 that is thereby chosen, the output of a memory cell 300 is connected to the output 202 of the read out device 200. Consequently, the bit stored in the memory cell 300 can be tapped off at the output 202. In other words, the bit that can be read out at the output is a function f(A, B, C, D) of the input variables A, B, C and D and furthermore depends on the bits stored in the memory cells 300. The 16 memory cells 300 are therefore configured with bits in accordance with the synthesis carried out before the input variables A, B, C and D are fed in.

Figure 4:
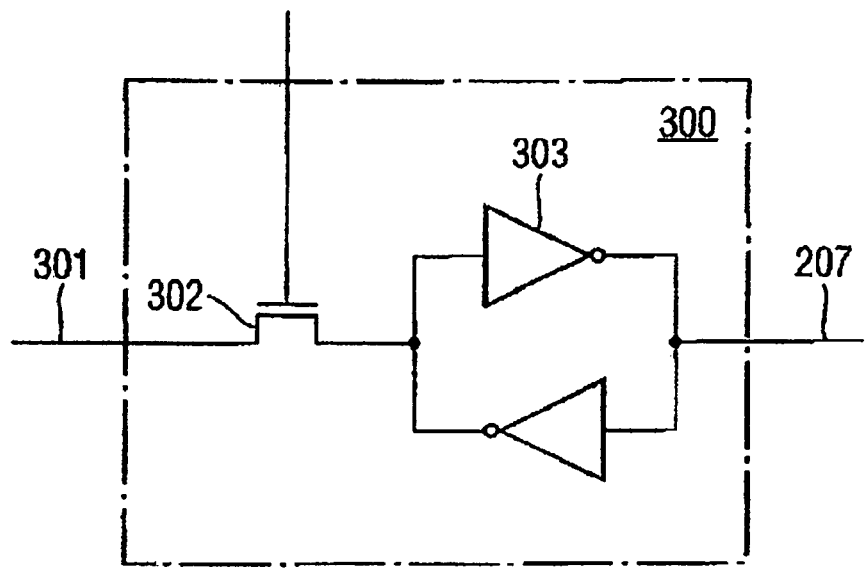
FIG. 4 shows a circuit diagram of an SRAM memory cell in accordance with the prior art.

FIG. 4 illustrates the circuit diagram of a memory cell 300 in accordance with the prior art. The memory cell 300 has an input 301, which serves for configuration with a bit. In the configuration mode, the source drain path of the MOS transistor 302 connected downstream of the input 301 is activated for this purpose. Arranged downstream of the MOS transistor 302 are two inverters 303, which are connected in parallel and in opposite directions with respect to one another. Storage of the bit fed in at the input 301 is effected by the arrangement of the two inverters 303. The inverted bit can be read out at an output 207 of the memory cell 300.

FIG. 5 represents a circuit diagram of a read out device 400 as a first exemplary embodiment of the readout device according to the invention. The read out device 400 corresponds in many parts to the read out device 200 illustrated in FIG. 3. Therefore, identical components are identified by the same reference symbols. The read out devices 200 and 400 differ in the interconnection of the inputs of the topmost multiplexer 206 in the first hierarchical level. In FIG. 5, a memory cell 500 is connected upstream of the multiplexer 206 and feeds the inputs of said multiplexer 206 via its outputs 501 and 502.

Figure 6:
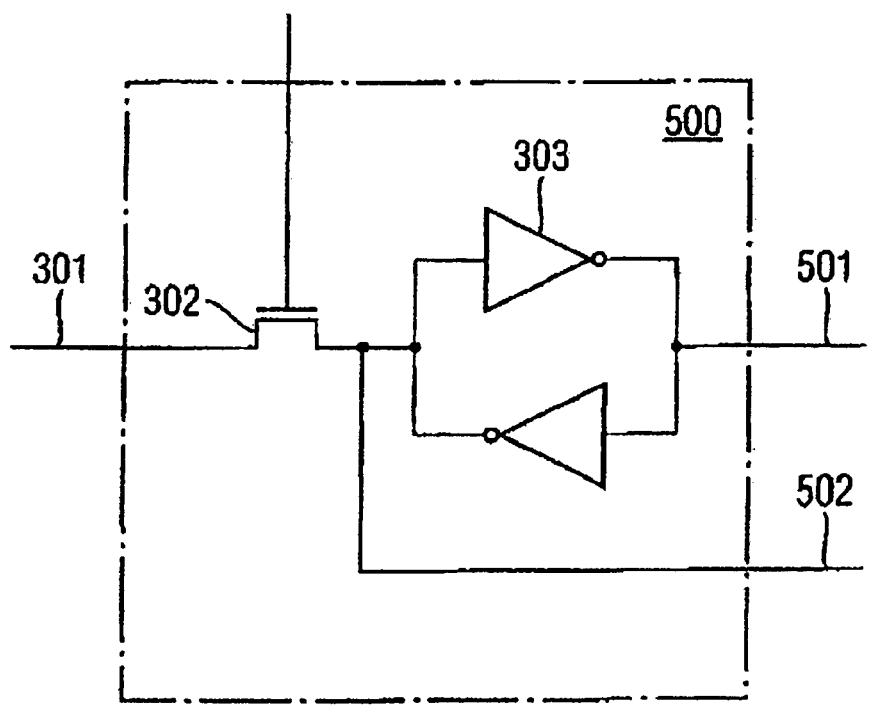
FIG. 6 shows a circuit diagram of a further SRAM memory cell.

A circuit diagram of the memory cell 500 is illustrated in FIG. 6. The memory cell 500 essentially has the same construction as the memory cell 300 shown in FIG. 4 and is also provided with the same reference symbols in this respect. Moreover, the memory cell 500 has the additional output 502, however, at which the bit as was read into the memory cell 500 at the input 301 is read out again. The inverted bit is read out at the output 501.

By virtue of the measure described, a memory cell 300 is saved in the case of the read out device 400 in comparison with the read out device 200. Furthermore, the configuration of a memory cell 300 is obviated. If, by way of example, the read out device 200 is configured with the configuration bit sequence 0111101011011110 consisting of 16 bits, then for the read-out device 400 the configuration bit sequence consisting of only 15 bits is 011101011011110. In this case, the front two underlined bits of the first mentioned sequence have been replaced by the first bit of the last mentioned sequence.

Figure 7:
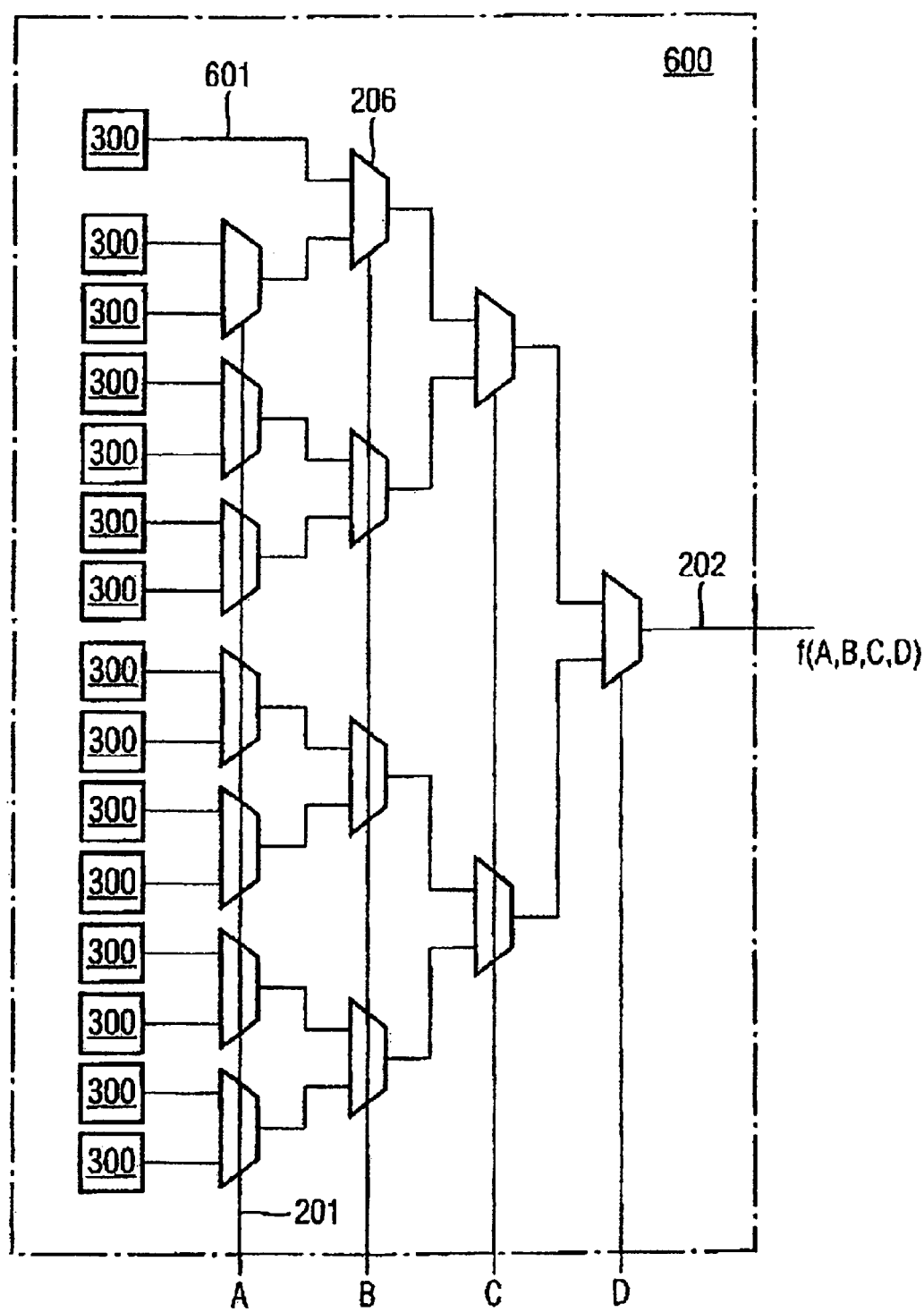
FIG. 7 shows a circuit diagram of a second exemplary embodiment of the read out device according to the invention.

A circuit diagram of a second exemplary embodiment of the read-out device according to the invention is represented in FIG. 7. The read out device 600 represented therein is again largely identical to the read out device 200. However, the read-out device 600 lacks the topmost multiplexer 206 of the first hierarchical level. Instead, the output 601 of the topmost memory cell 300 is directly connected to an input of the topmost multiplexer 206 of the second hierarchical level. A multiplexer 206 and a memory cell 300 have thereby been saved.

Figure 8:
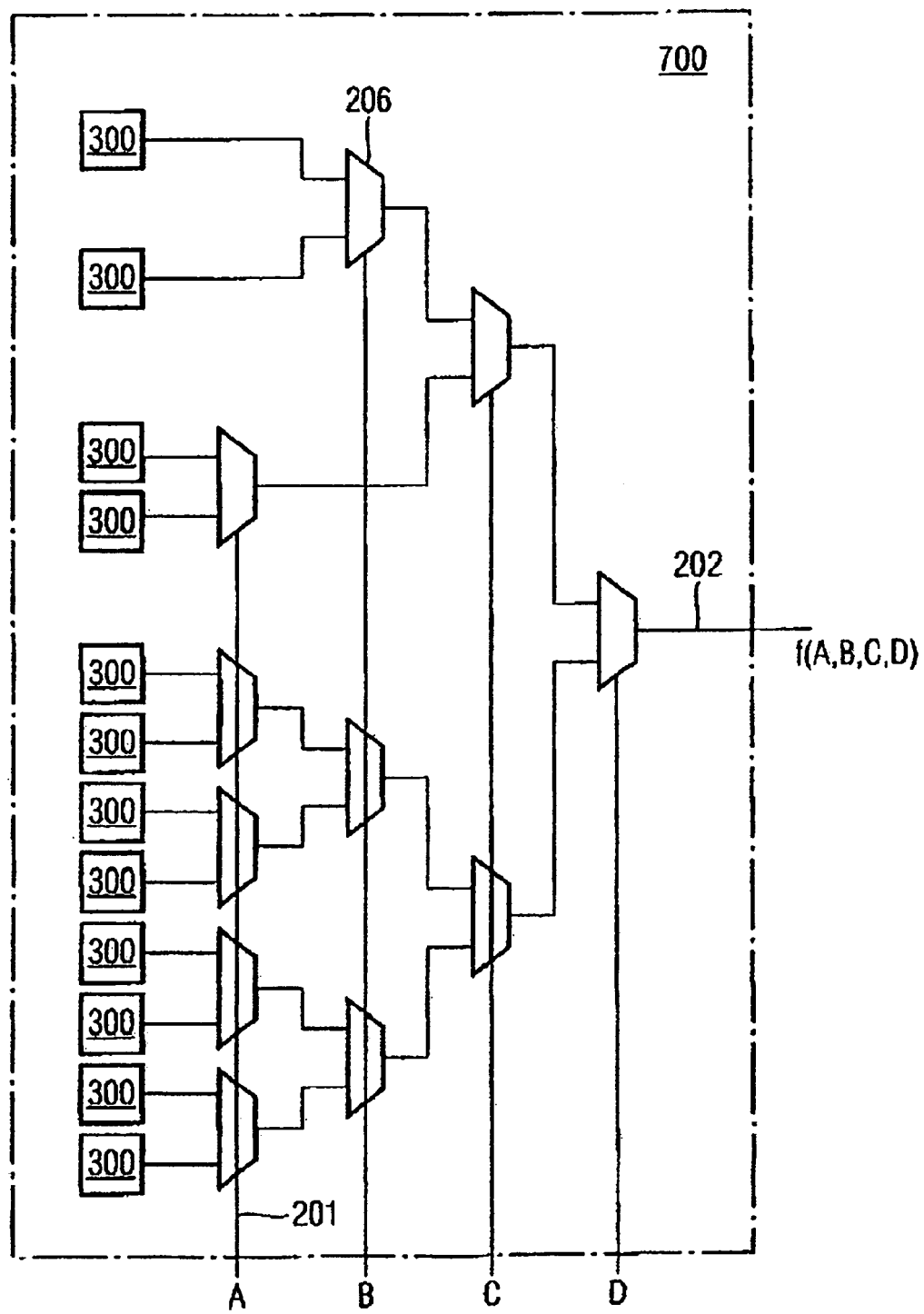
FIG. 8 shows a circuit diagram of a third exemplary embodiment of the read out device according to the invention.

FIG. 8 represents a circuit diagram of a read-out device 700 as a third exemplary embodiment of the readout device 400 according to the invention. In this case, in comparison with the read out device 200, the lower branch of the multiplexer tree has been retained, while the multiplexers 206 of the upper branch of the multiplexer tree and thus also the memory cells 300 have been significantly reduced. This brings about a significant reduction of area and significantly less outlay for the configuration of the memory cells 300. However, it should be taken into consideration that now only 12 configuration bits are available and the number of logic functions that can be mapped has thus fallen to $2^{12}$=4096. However, calculations have revealed that the number of permutation classes is 2032. Even though in each case four multiplexers 206 and memory cells 300 have been saved, the number of permutation classes for the read out device 700 is still more than half of the permutation classes of the read out device 200.

Figure 9:
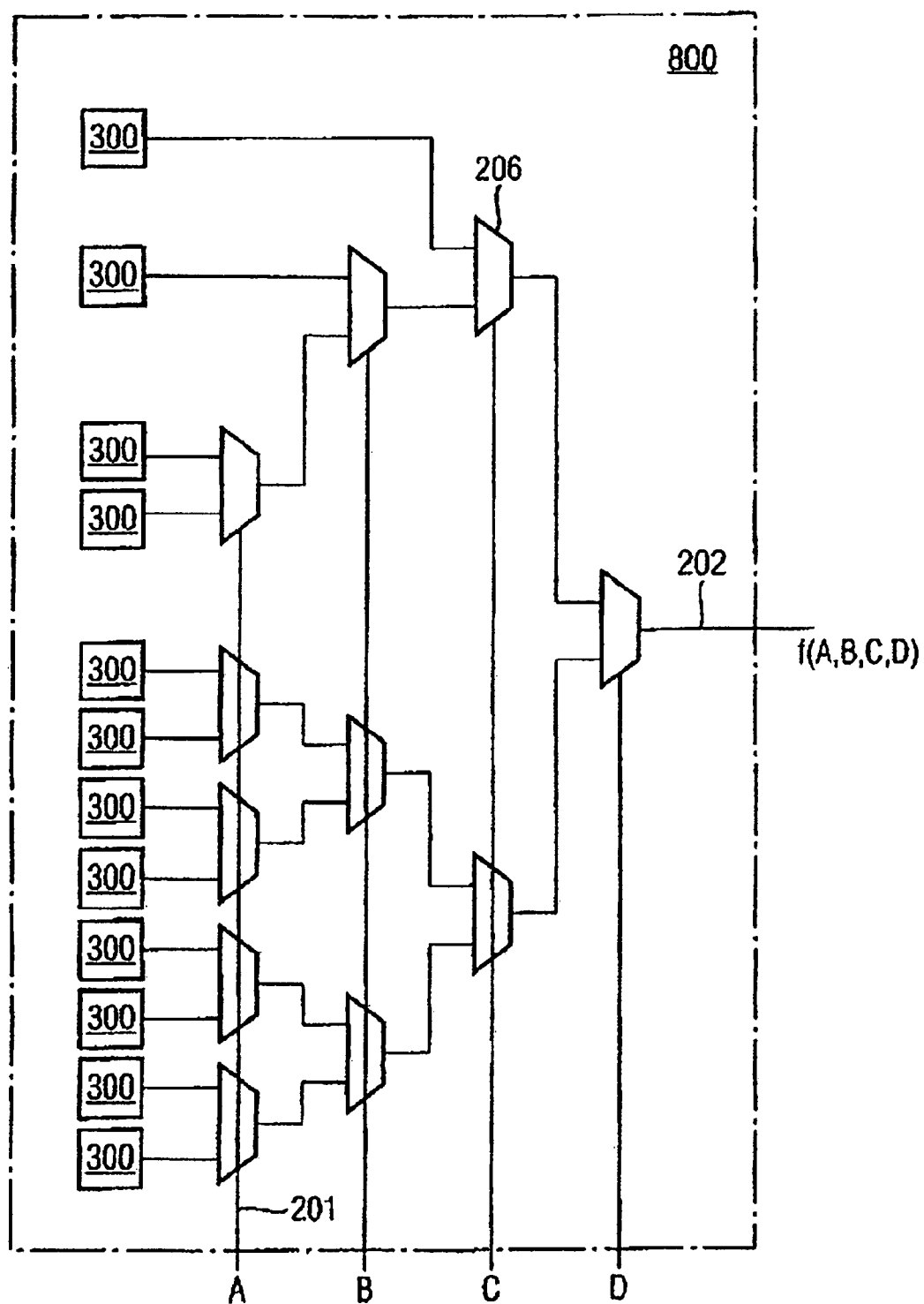
FIG. 9 shows a circuit diagram of a fourth exemplary embodiment of the read out device according to the invention.
Figure 10:
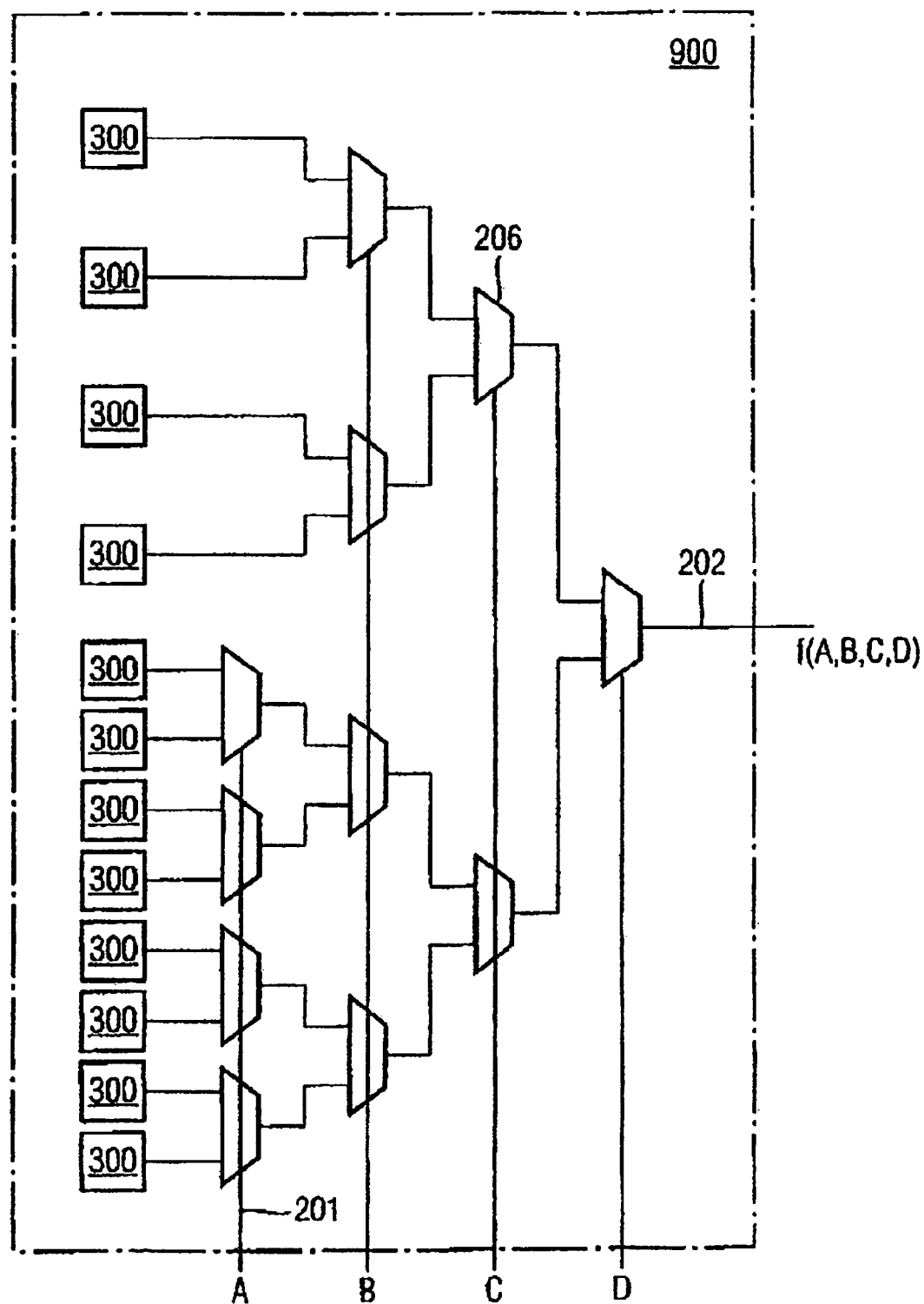
FIG. 10 shows a circuit diagram of a fifth exemplary embodiment of the read out device according to the invention.

FIGS. 9 and 10 show read out devices 800 and 900 as fourth and fifth exemplary embodiments of the invention. In the read out devices 800 and 900, too, the lower branch of the multiplexer tree is complete, while the upper branch has in each case been reduced in a different way. In read out devices 700 and 800 precisely one multiplexer 206 is in each of the first three hierarchical levels in the upper branch. It has been determined from calculations that, among the read-out devices 700, 800 and 900, the read-out device 700 has the most permutation classes.

The SRAM memory cells 300 and 500 shown in FIGS. 4 and 6 were used for the realization of the read out devices 400, 600, 700, 800 and 900. However, the invention is not limited to memory cells of this type. Rather, memory cells based on other memory techniques may also be used for the realization of the read out devices 400, 600, 700, 800 and 900. By way of example, it is also possible to use non-volatile FLASH cells.

FIG. 11 shows a circuit diagram of another exemplary embodiment of a read-out device 1100 according to the invention. In read out device 1100 at least two memory cells can be selected and the data words or data bits stored in the relevant memory cells can be read out. This read-out device 1100 comprises at least two of the above-described read-out devices. As shown in FIG. 11, the read-out device 1100 comprises two of the read-out devices 400. The multiplexer arrangements of these at least two read-out devices in each case comprise the same number of hierarchical levels. In particular, the multiplexer arrangements are also constructed identically, i.e. they have multiplexer trees that are reduced in the same way. Furthermore, the at least two read-out devices are connected in parallel, so that inputs associated with the same hierarchical levels are in each case fed with the same input variables. Consequently, the content of a memory cell, that is to say a data bit, for example, is read out from each of the at least two read out devices at the same time.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A read-out device for selecting a memory cell from a plurality of memory cells and for reading out a data word stored in the memory cell, the read-out device comprising:
   the plurality of memory cells, in each of which a data word is stored;
   a plurality of inputs for feeding in input variables, on the basis of which the memory cell whose data word is read out can be selected; and
   a hierarchical arrangement of multiplexers having N hierarchical levels, each multiplexer having M inputs, control inputs of the multiplexers of a hierarchical level being connected to an input of the read-out device, inputs of the hierarchical arrangements of multiplexers being connected to outputs of the memory cells, the number of memory cells being less than $M^N$.

2. The read-out device according to claim 1, wherein at least one kth hierarchical level has fewer than $M^{N-k}$ multiplexers, higher hierarchical levels having rising k in which 1<k<N.

3. The read-out device according to claim 2, wherein a regular hierarchical arrangement of multiplexers is connected upstream of an input of the multiplexer of the Nth hierarchical level, the regular hierarchical arrangement of multiplexers comprises N-1 hierarchical levels, and each hierarchical level of the regular hierarchical arrangement of multiplexers has $M^{N-k-1}$ multiplexers.

4. The read-out device according to claim 3, wherein reduced hierarchical arrangements of multiplexers are connected upstream of the input or inputs of the multiplexer of the Nth hierarchical level, each of the reduced hierarchical arrangements of multiplexers comprises N-1 hierarchical levels, and each hierarchical level of the reduced hierarchical arrangements of multiplexers has precisely one multiplexer.

5. The read-out device according to claim 1 wherein at least one of:
   the output of at least one memory cell is connected to a multiplexer from the second or higher hierarchical level; and
   an output of at least one multiplexer from a kth hierarchical level is connected to an input of a multiplexer from the (k+2)th or higher hierarchical level.

6. The read-out device according to claim 1, wherein at least one memory cell is connected to more than one input of a multiplexer.

7. The read-out device according to claim 6, wherein the at least one memory cell has a first output at which the data word stored in the memory cell can be tapped off and a second output at which an inverse of the data word stored in the memory cell can be tapped off.

8. The read-out device according to claim 1, wherein the number M of inputs of the multiplexers is equal to two.

9. The read-out device according to claim 1, wherein the memory cells have configuration inputs for feeding in the data words.

10. A device for selecting at least two memory cells from a plurality of memory cells and for reading out data words stored in the at least two memory cells, the device comprising at least two read-out devices, each read-out device including:
    the plurality of memory cells, in each of which a data word is stored; a plurality of
    inputs for feeding in input variables, on the basis of which the memory cell whose data word is read out can be selected; and
    a hierarchical arrangement of multiplexers having N hierarchical levels, each multiplexer having M inputs, control inputs of the multiplexers of a hierarchical level being connected to an input of the read-out device, inputs of the hierarchical arrangements of multiplexers being connected to outputs of the memory cells and the number of memory cells being less than $M^N$,
    wherein the at least two readout devices have the same number of hierarchical levels and the same input variables is fed into the inputs of the at least two read-out devices.

11. A programmable logic arrangement comprising configurable logic cells, at least one of the configurable logic cells having at least one read-out device, each read-out device including:
    a plurality of memory cells, in each of which a data word is stored;
    a plurality of inputs for feeding in input variables, on the basis of which the memory cell whose data word is read out can be selected; and
    a hierarchical arrangement of multiplexers having N hierarchical levels, each multiplexer having M inputs, control inputs of the multiplexers of a hierarchical level being connected to an input of the read-out device, inputs of the hierarchical arrangements of multiplexers being connected to outputs of the memory cells, and the number of memory cells being less than $M^N$.

12. The programmable logic arrangement of claim 11, wherein the programmable logic arrangement is a Field Programmable Gate Array (FPGA).

* * * * *